(12) United States Patent
Onitsuka et al.

(10) Patent No.: US 12,009,285 B2
(45) Date of Patent: Jun. 11, 2024

(54) SUBSTRATE HAVING A RECESSED PORTION FOR AN ELECTRONIC COMPONENT

(71) Applicant: KYOCERA Corporation, Kyoto (JP)

(72) Inventors: Yoshitomo Onitsuka, Kyoto (JP); Tomoyuki Iwata, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 93 days.

(21) Appl. No.: 17/604,779

(22) PCT Filed: Apr. 22, 2020

(86) PCT No.: PCT/JP2020/017332
§ 371 (c)(1),
(2) Date: Oct. 19, 2021

(87) PCT Pub. No.: WO2020/218335
PCT Pub. Date: Oct. 29, 2020

(65) Prior Publication Data
US 2022/0199499 A1     Jun. 23, 2022

(30) Foreign Application Priority Data

Apr. 22, 2019  (JP) .................................. 2019-081098

(51) Int. Cl.
*H01L 23/495*     (2006.01)
*H01L 21/48*      (2006.01)
(Continued)

(52) U.S. Cl.
CPC ...... *H01L 23/49534* (2013.01); *H01L 21/486* (2013.01); *H01L 21/76805* (2013.01);
(Continued)

(58) Field of Classification Search
CPC ......... H01L 24/83; H01L 24/24; H01L 24/32; H01L 21/486; H01L 21/4857;
(Continued)

(56) References Cited

U.S. PATENT DOCUMENTS 10,643,919 B2 * 5/2020 Oh ........................... H01L 23/16
11,552,220 B2 * 1/2023 Itakura ................... H01L 23/13
(Continued)

FOREIGN PATENT DOCUMENTS

JP     2008-034494 A     2/2008
JP     2013-182909 A     9/2013

*Primary Examiner* — Alonzo Chambliss
(74) *Attorney, Agent, or Firm* — Volpe Koenig (57) ABSTRACT

A package for housing an electronic component includes: a base portion including a first surface including a recessed portion in which an electronic component is mounted and also including a second surface located on an opposite side to the first surface; an external connection conductor located on the second surface; internal wiring located inside the base portion; first wiring located on the second surface and connected to the internal wiring; and second wiring located between the first wiring and the external connection conductor and connected to the external connection conductor, in which the first wiring and the second wiring are covered with an insulating layer.

20 Claims, 4 Drawing Sheets

(51) Int. Cl.
*H01L 21/768* (2006.01)
*H01L 23/00* (2006.01)
*H01L 23/12* (2006.01)
*H01L 23/48* (2006.01)
*H01L 23/498* (2006.01)
*H01L 23/522* (2006.01)

(52) U.S. Cl.
CPC ............ *H01L 23/12* (2013.01); *H01L 23/481* (2013.01); *H01L 23/49822* (2013.01); *H01L 23/5226* (2013.01); *H01L 24/24* (2013.01); *H01L 24/32* (2013.01); *H01L 24/83* (2013.01)

(58) Field of Classification Search
CPC ............. H01L 23/49534; H01L 23/481; H01L 21/76805; H01L 23/13; H01L 23/5226; H01L 23/49822
See application file for complete search history.

(56) References Cited

U.S. PATENT DOCUMENTS

| | | | | |
|---|---|---|---|---|
| 2011/0127655 | A1* | 6/2011 | Fujii | H01L 23/04 257/664 |
| 2016/0043047 | A1* | 2/2016 | Shim | H01L 23/5389 438/126 |
| 2016/0278214 | A1* | 9/2016 | Hayashi | H05K 1/115 |
| 2018/0358949 | A1* | 12/2018 | Kisaki | H01L 23/049 |
| 2019/0139853 | A1* | 5/2019 | Oh | H01L 23/562 |

* cited by examiner

SUBSTRATE HAVING A RECESSED PORTION FOR AN ELECTRONIC COMPONENT

TECHNICAL FIELD

The present invention relates to a package for housing an electronic component to be mounted thereon, and an electronic device and an electronic module.

BACKGROUND ART

There has been conceived a technique for checking electrical properties of electronic components mounted in recesses of packages for housing electronic components and that are arrayed on a mother substrate, by placing an electrical inspection probe in contact with electrodes exposed in the recesses of the packages for housing electronic components. In this case, a portion of the electrodes located in the recessed portion of each package for housing an electronic component needs to be electrically independent, and hence, connection wiring that is connected to the electrode is cut (see Japanese Patent Application Laid-open No. 2008-34494).

SUMMARY

A package for housing an electronic component according to the present disclosure includes: a base portion including a first surface including a recessed portion in which an electronic component is mounted, and also including a second surface located on an opposite side to the first surface; an external connection conductor located on the second surface; internal wiring located inside the base portion; first wiring located on the second surface and connected to the internal wiring; and second wiring located between the first wiring and the external connection conductor and connected to the external connection conductor, in which the first wiring and the second wiring are covered with an insulating layer.

An electronic device according to the present disclosure includes an electronic component at a mounting portion of the package for housing an electronic component described above.

An electronic module of the present disclosure includes a module board and the electronic device with the configuration described above connected to the module board.

DESCRIPTION OF EMBODIMENTS

A package for housing an electronic component, an electronic device, and an electronic module according to the present disclosure will be described with reference to the attached drawings.

In FIGS. 1 to 8, "100" indicates a package for housing an electronic component; "101" indicates an insulating substrate; "102" indicates a first surface; "103" indicates a second surface; "104" indicates an electronic component; "105" indicates a base portion; "106" indicates a frame portion; "107" indicates a recessed portion; "108" indicates an electrode; "109" indicates connection wiring; "109a" indicates first wiring; "109b" indicates second wiring; "110" indicates an insulating layer; "111" indicates a frame-shaped metallization layer; "112" indicates a narrow portion; "113" indicates internal wiring (via conductor); "114" indicates a notch; "115" indicates an external connection conductor; "116" indicates a groove; "117" indicates a lid; "118" indicates an alignment portion; and "119" indicates a dent.

The insulating substrate 101 included in the package 100 for housing an electronic component is formed by layering a plurality of insulating layers made of, for example, an aluminum oxide-based sintered body, an aluminum nitride-based sintered body, a mullite-based sintered body, a glass ceramic sintered body, or the like. In a case where the insulating substrate 101 includes, for example, an insulating layer made of an aluminum oxide-based sintered body, the insulating substrate 101 can be manufactured from a mother substrate (not illustrated) obtained by fabricating a plurality of ceramic green sheets obtained by forming sheets of a ceramic powder consisting of aluminum oxide as a main constituent and adding silicon oxide, calcium oxide, magnesium oxide, or the like thereto together with an organic solvent and a binder, and then layering and firing these ceramic green sheets. The mother substrate has a thickness, for example, in a range of from approximately 0.3 mm to approximately 2 mm. In addition, wiring board regions (not illustrated) each having a quadrilateral shape having a length of one side in plan view of from approximately 1.2 mm to approximately 10 mm and each serving as the package 100 for housing an electronic component are arrayed in the vertical and horizontal directions.

Figure 1:
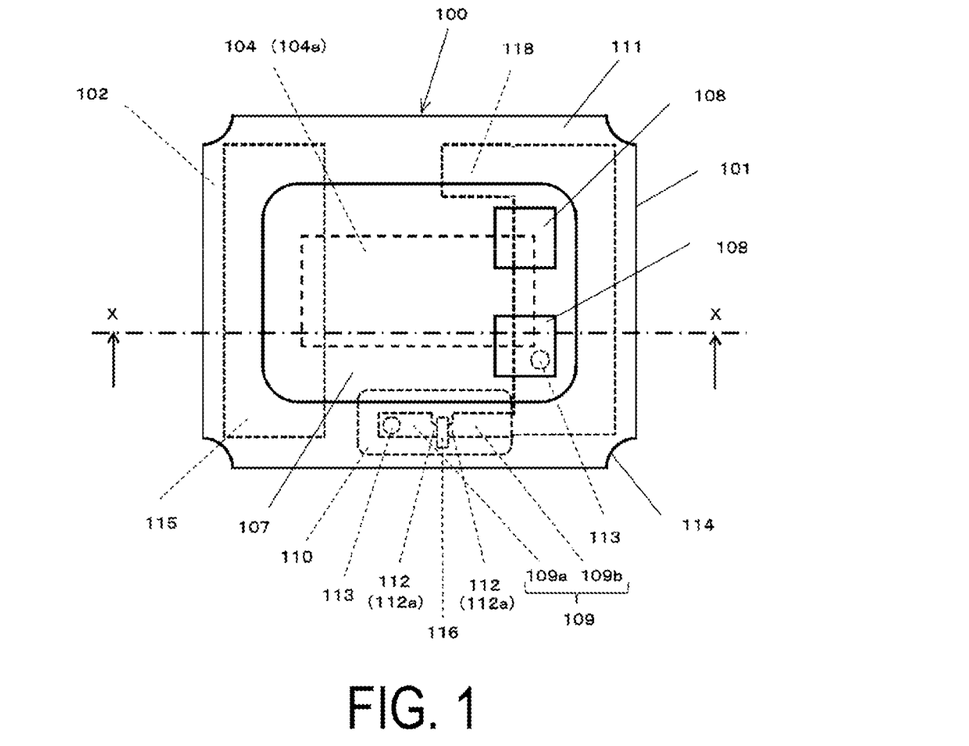
FIG. 1 is a perspective plan view illustrating a package for housing an electronic component, and an electronic device, and an electronic module according to the present disclosure.
Figure 2:
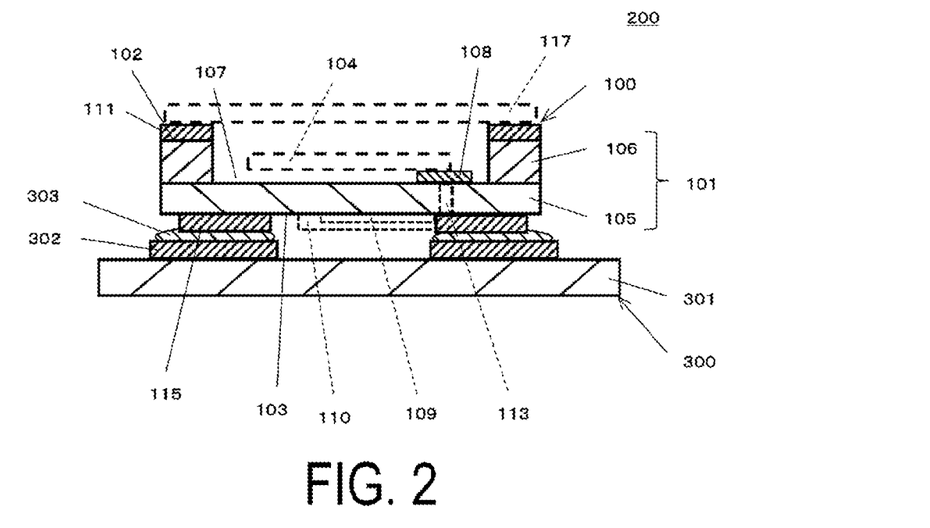
FIG. 2 is a cross-sectional perspective view taken along the line X-X in FIG. 1.

As illustrated in FIGS. 1 and 2, the recessed portion 107 in which the electronic component 104 is to be mounted is located on the first surface 102 side of the package 100 for housing an electronic component. In addition, the four corners of the package 100 for housing an electronic component may each be provided with a notch 114 for suppressing chipping at the time of handling. After the electronic component 104 is mounted in the recessed portion 107, the recessed portion 107 is closed off with the lid 117 made of a metal such as an iron-nickel-cobalt alloy so as to hermetically seal the electronic component 104 within the recessed portion 107.

The electronic component 104 mounted in the recessed portion 107 includes, for example, a piezoelectric element such as a piezoelectric oscillator (for example, crystal oscillation element), a semiconductor element such as a semiconductor memory element, a capacitative element, a resistor, or the like.

A plurality of electrodes 108 are located on the bottom surface of the recessed portion 107 described above. Each of the electrodes 108 is to be electrically connected to a corresponding electrode (not illustrated) of the electronic component 104 mounted in the recessed portion 107, and, in order to facilitate the electrical connection to the electrode of the electronic component 104, a metal layer made of nickel, gold, or the like is located on an exposed surface of the electrode 108. The shape of the electrode 108 is not limited to a quadrilateral shape as illustrated in FIG. 1. The electrode 108 may have an elliptical shape or a circular shape so as to correspond to the shape or type of the electronic component 104, or have a shape obtained by combining the shapes described above. For example, in a case where the electronic component 104 is a crystal oscillation element having a rectangular sheet-like shape, a pair of electrodes (not illustrated) located on a lower surface of the crystal oscillation element are disposed so as to face a pair of electrodes 108 located in the recessed portion 107, and the pair of electrodes of the electronic component 104 and the pair of electrodes 108 are electrically and mechanically connected through an electrically conductive adhesive or the like. The electronic component 104 mounted at the recessed portion 107 may have a configuration in which plural different types are mounted.

Note that, as illustrated, for example, in FIG. 2, the electrode 108 is connected, through the internal wiring 113 located in the base portion 105, to the external connection conductor 115 located on the second surface 103 of the insulating substrate 101. Furthermore, the external connection conductor 115 and the second wiring 109b of the connection wiring 109 are connected on the second surface 103. In addition, the first wiring 109a of the connection wiring 109 and the frame-shaped metallization layer 111 located on the first surface 102 side of the frame portion 106 are electrically connected through the internal wiring 113. Furthermore, the narrow portion 112 having a narrow width is located at a portion of the second wiring 109b. In addition, the connection wiring 109 including the first wiring 109a and the second wiring 109b is configured to be covered with the insulating layer 110.

The electrode of the electronic component 104 electrically connected to the electrode 108 is electrically connected to an external module board 301 through the electrode 108 of the recessed portion 107, the internal wiring 113, and the external connection conductor 115. An electric circuit for computation and oscillation and the like is formed between the electronic component 104 and the module board 301 that are electrically connected to each other.

Furthermore, the electrode 108, the internal wiring 113, the external connection conductor 115, and the like are made of, for example, a metal material such as tungsten, molybdenum, manganese, copper, silver, palladium, gold, or platinum, and are deposited on the insulating substrate 101 through a metallizing method, a plating method, or the like. For example, in a case where the electrode 108 consists of a metallization layer made of tungsten, the electrode 108 can be formed by adding an organic solvent and a binder to tungsten powder to prepare a metal paste, and printing a predetermined pattern of the metal paste on a predetermined portion of the bottom surface of the recessed portion 107 of a ceramic green sheet serving as a mother substrate where wiring board regions are arrayed.

In addition, a dummy region having a frame shape is disposed in an outer peripheral part of the mother substrate so as to surround a plurality of wiring board regions, and a plating common conductor having a frame shaped pattern is located in the dummy region. The frame-shaped metallization layer 111 is located on the first surface 102 of each of the wiring board regions arrayed on the mother substrate. The frame-shaped metallization layer 111 in each of the wiring board regions located on the outer periphery so as to be adjacent to the dummy region is connected to the plating common conductor. Furthermore, frame-shaped metallization layers 111 of adjacent wiring board regions are connected so as to be electrically integrated with each other within the mother substrate. Thus, by supplying electricity from the plating common conductor to a wiring conductor in each of the wiring board regions through the frame-shaped metallization layers 111, it is possible to position a metal layer made of nickel, gold, or the like through an electrical plating method on the wiring conductor where the electrode 108, the external connection conductor 115, or the like is exposed.

The package 100 for housing an electronic component according to the present disclosure includes: the base portion 105 including the first surface 102 including the recessed portion 107 in which the electronic component 104 is mounted, and also including the second surface 103 located on an opposite side to the first surface 102; the external connection conductor 115 located on the second surface 103; the internal wiring 109 located inside the base portion 105; the first wiring 109a located on the second surface 103 and connected to the internal wiring 109; and the second wiring 109b located between the first wiring 109a and the external connection conductor 115 and connected to the external connection conductor 115, in which the first wiring 109a and the second wiring 109b are covered with the insulating layer 110.

With this configuration, it is possible to suppress cutting chips from scattering to the recessed portion 107 side even if the second wiring 109b of the connection wiring 109 is cut using a laser in order to cause the electrode 108 connected to the electronic component 104 to be independent so that the electronic component 104 mounted at the recessed portion 107 can be electrically checked. In other words, in a state of a mother substrate in which wiring board regions, which are each to be the package 100 for housing an electronic component, are arrayed, the connection wiring 109 including the first wiring 109a and the second wiring 109b functions as an electricity conducting path used to supply electricity to each of the wiring conductors. By cutting the second wiring 109b of the connection wiring 109, one of the electrodes 108 is configured to be electrically independent. The first wiring 109a and the second wiring 109b of the connection wiring 109 are located on the second surface 103 side that is on the opposite side to the first surface 102 where the recessed portion 107 is disposed. Thus, cutting chips are less likely to scatter toward the recessed portion 107 side even if the second wiring 109b is cut with a laser.

Specifically, in a state where a plurality of wiring board regions, which are each to be the package 100 for housing an electronic component, are arrayed on the mother substrate, a pair of electrodes (not illustrated) located on the lower surface of the electronic component 104 such as a crystal oscillation element are disposed so as to face the pair of electrodes 108 located in the recessed portion 107 of each of the wiring board regions. In addition, the pair of electrodes of the electronic component 104 and the pair of electrodes 108 located in the recessed portion 107 are electrically and mechanically connected through an electrically conductive adhesive or the like. Furthermore, in order to hermetically seal the recessed portion 107, the lid 117 made of a metal or the like is bonded to the frame-shaped metallization layer 111 located on the first surface 102 using a bonding material such as a brazing material. Then, the mother substrate is flipped over, and a laser is emitted from the second surface 103 side onto the second wiring 109b of each of the wiring board regions so as to cut the second wiring 109b. In this manner, the electricity conducting path connected between adjacent wiring board regions is cut with the groove 116, which results in a configuration in which one of the electrodes 108 in each of the wiring board regions becomes electrically independent.

The connection wiring 109 including the first wiring 109a and the second wiring 109b is located on the second surface 103 side that is on the opposite side to the recessed portion 107, which enables the second wiring 109b to be cut either before the electronic component 104 is mounted or after the electronic component 104 is mounted. In order to suppress cutting chips from scattering toward the recessed portion 107 side, it is preferable to cut the second wiring 109b after the electronic component 104 is mounted and the recessed portion 107 is sealed with the lid 117.

Figure 6:
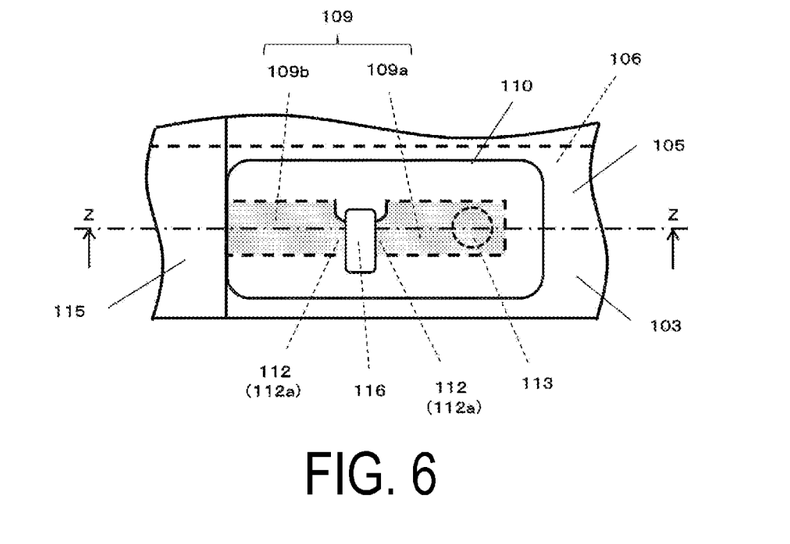
FIG. 6 is a back-surface perspective view illustrating, in an enlarged manner, a main portion of a package for housing an electronic component according to an embodiment of the present disclosure.
Figure 7:
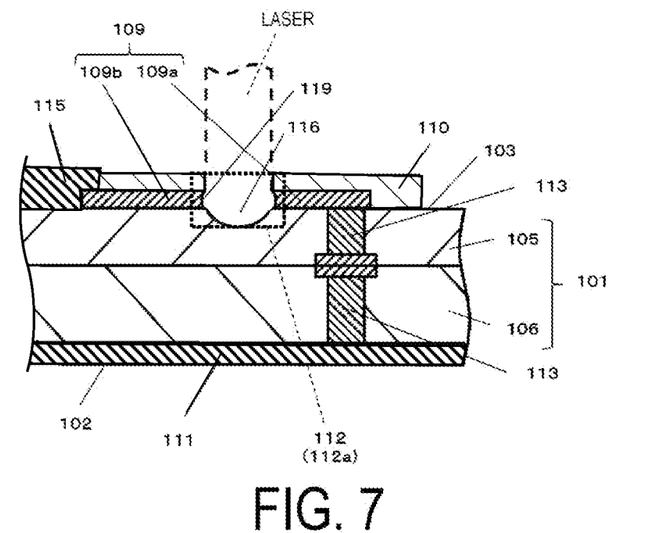
FIG. 7 is a cross-sectional perspective view taken along the line Z-Z in FIG. 6.

Furthermore, the connection wiring 109 including the first wiring 109a and the second wiring 109b is configured to be covered with the insulating layer 110. This configuration makes it possible to suppress cutting chips from scattering when the second wiring 109b is cut with a laser. In other words, as illustrated in FIGS. 4 to 7, the connection wiring 109 is covered with the insulating layer 110. In addition, an inner wall of the insulating layer 110 that has been cut with laser functions as a dam as illustrated in FIG. 7. This makes it possible to reduce the area where the cutting chips of the second wiring 109b scatter even if the second wiring 109b of the connection wiring 109 located further toward the first surface 102 side than the insulating layer 110 in the thickness direction of the insulating substrate 101 is cut with the laser. Note that the cutting chips of the insulating layer 110 are insulators and the cutting chips of the second wiring 109b are conductors. Thus, by reducing the region where the cutting chips that are conductors of the second wiring 109b scatter, it is possible to suppress a short circuit or the like due to scattering of the cutting chips that are conductors, which makes it possible to reduce the impact on the stable operation of the electronic component 104.

Furthermore, the connection wiring 109 including the first wiring 109a and the second wiring 109b is configured to be covered with the insulating layer 110. With this configuration, the first wiring 109a or the second wiring 109b is not brought into contact with the bonding material such as solder. Thus, at the time of connecting an electronic device 200 including the package 100 for housing an electronic component to the module board 301 using a bonding material 303 such as solder as illustrated in FIG. 2, the bonding material 303 used to connect the external connection conductor 115 located on the second surface 103 and a connection pad 302 located on the module board 301 is less likely to spread to the first wiring 109a side and the second wiring 109b side. This enables the external connection conductor 115 connected to the connection wiring 109 to be less likely to short circuit with other external connection conductors 115.

Note that the insulating layer 110 may cover a portion of the connection wiring 109 including the first wiring 109a and the second wiring 109b or may entirely cover the connection wiring 109. In a case where the insulating layer 110 covers a portion of the connection wiring 109, it is possible to suppress spreading of the bonding material 303 toward the second wiring 109b side of the connection wiring 109 if the insulating layer 110 covers, for example, the external connection conductor 115 side to be connected to the connection wiring 109. In addition, if the second wiring 109b of the connection wiring 109 is not covered with the insulating layer 110, this makes it easy to cut the second wiring 109b with a laser. On the other hand, in a case where the insulating layer 110 entirely covers the connection wiring 109, the bonding material does not spread to the connection wiring 109 side and the connection wiring 109 is not exposed to the outside. Thus, the metal layer made of nickel or gold or the like is not located on the connection wiring 109 in the plating step, which makes it possible to reduce usage of a noble metal, which leads to a reduction in cost.

The package 100 for housing an electronic component according to the present disclosure includes: the insulating substrate 101 including the first surface 102 including the recessed portion 107 in which the electronic component 104 is mounted, and also including the second surface 103 located on an opposite side to the first surface 102; the external connection conductor 115 located on the second surface 103; the internal wiring 113 located inside the insulating substrate 101; the first wiring 109 a located on the second surface 103 and connected to the internal wiring 113; and the second wiring 109 b located between the first wiring 109 a and the external connection conductor 115 and connected to the external connection conductor 115, in which the first wiring 109 a and the second wiring 109 b are covered with the insulating layer 110.

Figure 3:
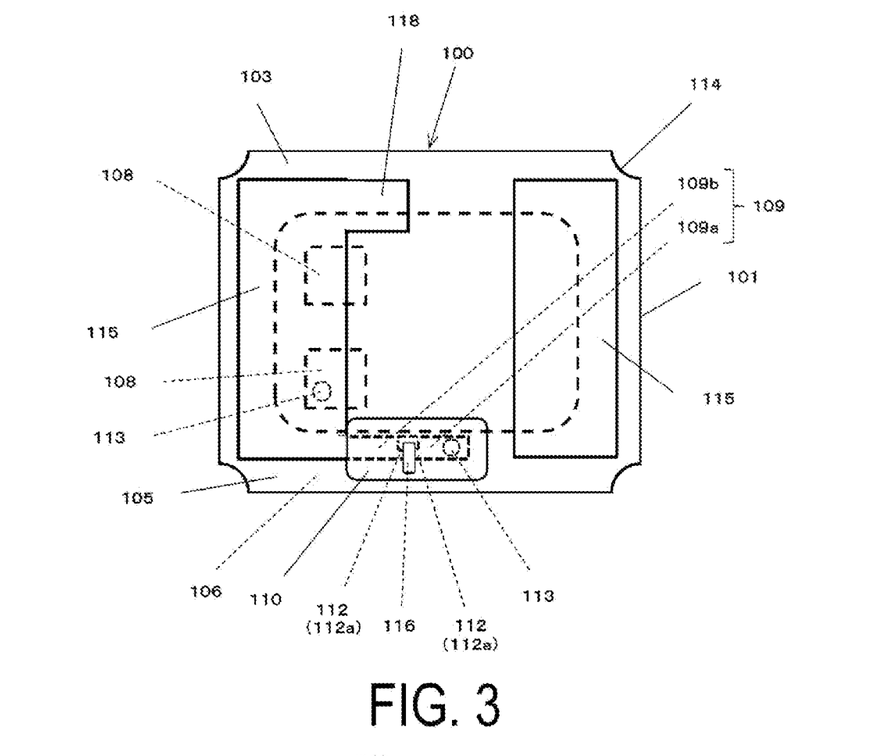
FIG. 3 is a back-surface perspective view illustrating the package for housing an electronic component according to the present disclosure.
Figure 4:
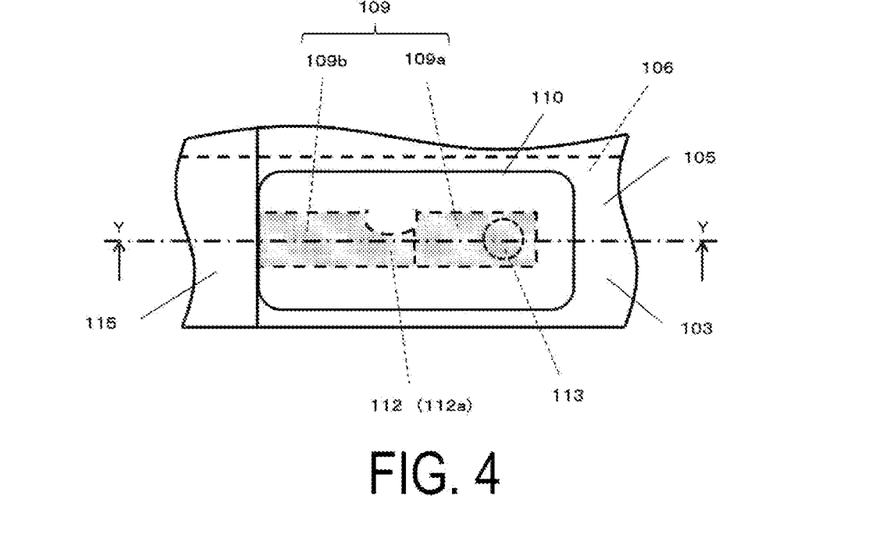
FIG. 4 is a back-surface perspective view illustrating, in an enlarged manner, a main portion of the package for housing an electronic component according to the present disclosure.

The insulating substrate 101 included in the package 100 for housing an electronic component includes the base portion 105 and the frame portion 106 as illustrated in FIG. 2, and the recessed portion 107 at which the electronic component 104 is mounted is located on the first surface 102 side. In addition, a plurality of external connection conductors 115 are located on the second surface 103 side of the package 100 for housing an electronic component, and are connected to a plurality of electrodes 108 located in the recessed portion 107. The external connection conductors 115 are configured such that a portion of each of the external connection conductors 115 is located so as to extend over both of the base portion 105 and the frame portion 106 in a perspective plan view, and one of the external connection conductors 115 is connected to the second wiring 109b of the connection wiring 109. As illustrated in FIGS. 4 and 6, the connection wiring 109 including the first wiring 109a and the second wiring 109b is located at a position that overlaps with the frame portion 106 in a perspective plan view. Even after the second wiring 109b of the connection wiring 109 is cut with a laser, the groove 116 is located at a portion of the base portion 105 that overlaps with the frame portion 106 as illustrated in FIG. 7. Thus, in a region that overlaps with the recessed portion 107 in a perspective plan view, there is no small-thickness region of the base portion 105. In other words, as illustrated in FIG. 3, in a perspective plan view, the connection wiring 109 does not overlap with a region of the recessed portion 107, and no small-thickness region of the base portion 105 exists in the region of the recessed portion 107. Thus, it is possible to suppress a decrease in the strength of the insulating substrate 101. This makes it possible to suppress the occurrence of cracks in the insulating substrate 101 due to mechanical stress resulting from deflection or the like of the module board 301, which makes it possible to improve the reliability of hermetic sealing of the electronic component 104 mounted at the recessed portion 107.

In the package 100 for housing an electronic component according to the present disclosure, the second wiring 109*b* has a portion located between the outer edge of the base portion 105 and the recessed portion 107 in a perspective plan view. With the configuration described above, even if the second wiring 109*b* of the connection wiring 109 is cut with a laser and the groove 116 is located on a portion of the insulating substrate 101, it is possible to suppress a decrease in the strength of the insulating substrate 101. This makes it possible to suppress the occurrence of cracks in the insulating substrate 101 due to mechanical stress resulting from deflection or the like of the module board 301 after the electronic device 200 is mounted on the module board 301 using the bonding material 303 such as solder. Thus, it is possible to dispose the connection wiring 109 on the second surface 103 side in a relatively free manner.

In other words, in a case where the connection wiring 109 is located between the outer edge of the base portion 105 and the recessed portion 107 in a perspective plan view, the connection wiring 109 is located at a position that overlaps with the frame portion 106 in a perspective plan view. In addition, even if the second wiring 109*b* of the connection wiring 109 is cut with a laser, the groove 116 is located on the base portion 105 that overlaps with the frame portion 106, which makes it possible to suppress a decrease in the strength of the insulating substrate 101 due to the groove 116. Furthermore, in a case where the connection wiring 109 is located in the recessed portion 107 in a perspective plan view, the second wiring 109*b* of the connection wiring 109 is provided so that the groove 116, which is a portion that has been cut with a laser, is not located on the inner side of the recessed portion 107. This enables a portion of the connection wiring 109 at the second surface 103 side to be located on the inner side of the recessed portion 107 while the strength of the insulating substrate 101 is less likely to decrease due to the groove 116. This makes it possible to dispose the electrically conducting path of the connection wiring 109 in a relatively free manner, which makes it easy to route wiring.

In recent years, the size of the package 100 for housing an electronic component has been increasingly reduced and the height thereof has been also reduced. This has led to a concern that the strength of the insulating substrate 101 may decrease due to the groove 116 formed with a laser. However, even if the second wiring 109*b* of the connection wiring 109 is cut with a laser as described above, by configuring the connection wiring 109 so as to have a portion located between the outer edge of the base portion 105 and the recessed portion 107 in a perspective plan view, the groove 116 formed with a laser is located at the base portion 105 that overlaps with the frame portion 106. This makes it possible to use the frame portion 106 to compensate for a reduction in the strength of the insulating substrate 101, thereby making it possible to suppress a decrease in the strength of the insulating substrate 101.

In the package 100 for housing an electronic component according to the present disclosure, the second wiring 109*b* includes the narrow portion 112 having a narrow width. This configuration described above makes it easy to cut the second wiring 109*b* of the connection wiring 109 with a laser. In other words, as illustrated in FIG. 4, the width of the second wiring 109*b* at a position where the narrow portion 112 is located is partially smaller than the width of the second wiring 109*b* in a region where the narrow portion 112 is not located. Thus, it is possible to reduce an area to be cut with a laser and cut the second wiring 109*b*, which makes it possible to minimize the scattering of cutting chips.

Furthermore, as illustrated in FIG. 3, if the narrow portion 112 is located at a position that overlaps with the frame portion 106 in a perspective plan view and also is located at a position closer to the center of the frame portion 106 in the width direction, the groove 116 is located at a position that is spaced apart from the recessed portion 107 and the outer periphery of the insulating substrate 101 after the second wiring 109*b* of the connection wiring 109 is cut with a laser. This further suppresses a decrease in the strength of the insulating substrate 101 in an effective manner, and provides a superior configuration in terms of reliability of hermetic sealing. Note that the narrow portion 112 is disproportionately positioned in the width direction of the connection wiring 109.

Furthermore, at the time of cutting the second wiring 109*b*, since the narrow portion 112 allows the laser irradiation area to be reduced in size, the cutting can be performed in a spot shape (circular shape) rather than a line shape as in the past. Thus, in a step of cutting the second wiring 109*b* with a laser, it is possible to reduce time for cutting the second wiring 109*b* to increase productivity. Note that the shape of the narrow portion 112 located at the second wiring 109*b* is not limited to the half-long-hole shape as illustrated in FIG. 4, and it may be possible to use a semicircular shape, a rectangular shape, an elliptical shape, a triangular shape, or the like.

Furthermore, since the connection wiring 109 including the first wiring 109*a* and the second wiring 109*b* is covered with the insulating layer 110, the position of the narrow portion 112 cannot be recognized when viewed from the second surface 103 side. Thus, as illustrated, for example, in FIG. 3, the alignment portion 118 configured by extending a portion of the external connection conductor 115 is positioned and the narrow portion 112 of the second wiring 109*b* is located on the extended line of the end portion of the alignment portion 118. This enables the position of the narrow portion 112 (that is, a portion to be cut with a laser) to be recognized even if the connection wiring 109 is covered with the insulating layer 110. Note that the shape of the alignment portion 118 is not limited to a form in which it has a quadrilateral shape illustrated in FIG. 3 and a portion of the external connection conductor 115 is extended. It may have a circular shape, a triangular shape, or other shapes, and may be located at a position that is spaced apart from the external connection conductor 115. In addition, an alignment portion (not illustrated) that makes it possible to identify the position of the narrow portion 112 may be located at a position that is not connected to the external connection conductor 115.

In the package 100 for housing an electronic component according to the present disclosure, the insulating layer 110 covers the narrow portion 112. With the configuration described above, it is possible to cut the second wiring 109*b* in a manner such that the groove 116 provided at the time of cutting the second wiring 109*b* with a laser is small, and it is possible to suppress the scattering of cutting chips that are conductors of the second wiring 109*b*. In other words, as illustrated in FIGS. 4 to 7, the second wiring 109*b* including the narrow portion 112 is covered with the insulating layer 110 and the inner wall of the insulating layer 110, which is provided by using a laser, functions as a dam as illustrated in FIG. 7. Thus, even if the second wiring 109*b* located further toward the first surface 102 side than the insulating layer 110 in the thickness direction of the insulating substrate 101 is cut with a laser, it is possible to reduce the area where cutting chips of the second wiring 109*b* scatter. In addition, the second wiring 109*b* of the connection wiring 109 is located on a lower layer than the insulating layer 110, and the inner wall of the insulating layer 110 effectively functions as a dam. Thus, it is possible to further reduce the area where cutting chips that are conductors of the second wiring 109*b* scatter.

The cutting chips of the insulating layer 110 are insulators and the cutting chips of the second wiring 109*b* are conductors. Thus, by reducing the region where the cutting chips that are conductors of the second wiring 109*b* scatter, it is possible to suppress a short circuit or the like due to the scattering of the cutting chips that are conductors, which makes it possible to reduce the impact on the stable operation of the electronic component 104. The emitted laser is more likely to be absorbed by a metal such as tungsten or molybdenum or the like that constitutes the connection wiring 109, as compared with the insulating layer 110. This leads to a tendency that the cutting width of the second wiring 109*b* is larger than the cutting width of the insulating layer 110 with a laser as illustrated in FIG. 7. Thus, it may be possible to employ a configuration in which a dent 119 is located on the cut surface on each of both sides of the second wiring 109*b*. In this case, the cutting chips that are conductors of the second wiring 109*b* are surrounded by the dent 119, which makes it possible to further reduce the region where the cutting chips scatter.

Figure 8:
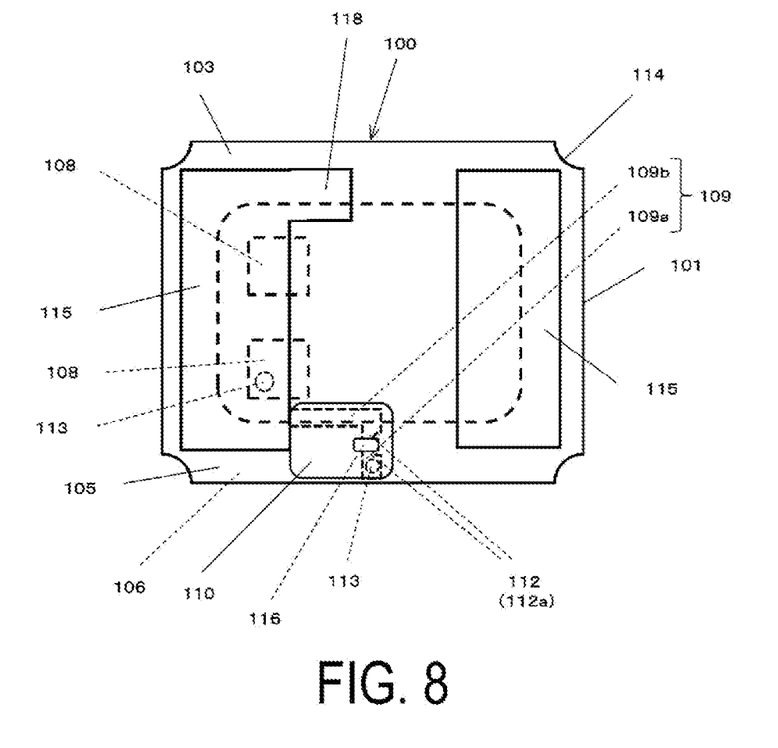
FIG. 8 is a back-surface perspective view illustrating the package for housing an electronic component according to the present disclosure.

Note that the arrangement of the connection wiring 109 relative to the package 100 for housing an electronic component has been described by giving an example in which the connection wiring 109 is located along the longer side of the insulating substrate 101 and at the longer side as illustrated in FIG. 3, and the cutting direction of the laser is a direction along the shorter side. However, the arrangement is not limited to that described above. For example, as illustrated in FIG. 8, the connection wiring 109 may be formed into an L shape in which the connection wiring is bent at a right angle, and be located on the longer side of the insulating substrate 101, and the cutting direction of the laser may be a direction along the longer side of the insulating substrate 101. With this configuration, even if the width of the frame portion 106 becomes smaller due to size reduction of the package 100 for housing an electronic component, the location that is irradiated with a laser is more likely to stay within the area of the frame portion 106 in a perspective plan view and the groove 116 caused by laser cutting is located at a position that straddles the base 105 and the frame 106 due to misalignment of the laser. In this way, a decrease in the strength of the insulating base plate 101 due to the groove 116 formed by the laser cutting can be suppressed. Note that, in the description above, the second wiring 109*b* included in the connection wiring 109 is formed into an L shape.

The package 100 for housing an electronic component according to the present disclosure includes the electrode 108 located in the recessed portion 107, and the first wiring 109*a* is electrically connected to the electrode 108 through internal wiring. With this configuration, the electrically conducting path used to allow the electrode 108 connected to the electronic component 104 to be electrically independent can be located on the back surface side (second surface 103 side) of the insulating substrate 101 so that the electronic component 104 mounted at the recessed portion 107 can be electrically checked.

By connecting the connection wiring 109 including the first wiring 109*a* and the second wiring 109*b* to the electrode 108 through the external connection conductor 115 and the internal wiring 113 as described above, it is possible to cause the external connection conductor 115 to function as an electrical check terminal in a state of being less likely to be influenced by other electrically conducting paths after the second wiring 109*b* of the connection wiring 109 is cut with a laser. Thus, it is not necessary to position a complicated electrically conducting path within the insulating substrate 101, and even if the second wiring 109*b* is cut with a laser, it is possible to suppress scattering of cutting chips toward the recessed portion 107 side. This makes it possible to provide the package 100 for housing an electronic component that can realize the electronic device 200 having superior operation reliability for the electronic component 104 as well as high reliability in terms of hermetic sealing.

The package 100 for housing an electronic component according to the present disclosure includes the frame-shaped metallization layer 111 located on the first surface 102, and the first wiring 109*a* is electrically connected to the frame-shaped metallization layer 111 through internal wiring. With this configuration, the connection wiring 109 including the first wiring 109*a* and the second wiring 109*b* is electrically connected through the internal wiring 113 to the frame-shaped metallization layer 111 located in a large area on the first surface 102 of the frame portion 106. This makes it easy to route plated wiring to each wiring conductor including the connection wiring 109. In other words, the package 100 for housing an electronic component is made of a mother substrate in which a plurality of wiring board regions, which are each to be the package 100 for housing an electronic component, are arrayed. The frame-shaped metallization layer 111 located in a large area on the first substrate 102 of the frame portion 106 can be used as an electrically conducting path. In addition, the connection wiring 109 is connected to the frame-shaped metallization layer 111. This makes it easy to route plated wiring to each wiring conductor. Furthermore, the metal layer made of nickel, gold, or the like can be efficiently positioned at a wiring conductor exposed at each wiring board region through an electroplating method.

Figure 5:
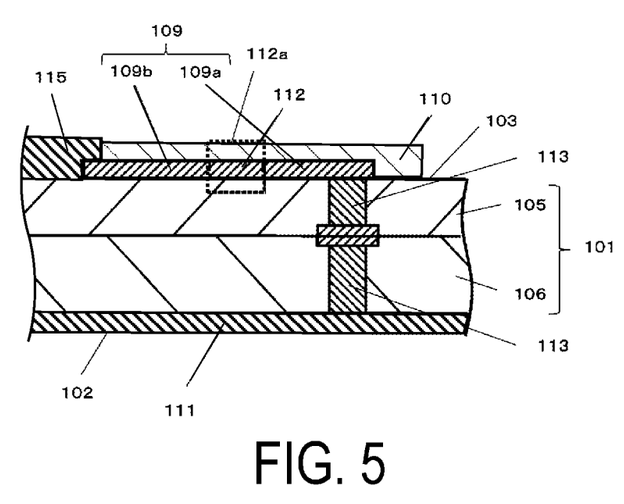
FIG. 5 is a cross-sectional perspective view taken along the line Y-Y in FIG. 4.

The frame-shaped metallization layer 111 and the first wiring 109*a* of the connection wiring 109 are electrically connected through the internal wiring 113 as illustrated in FIGS. 5 and 7. By positioning the connection wiring 109 including the first wiring 109*a* and the second wiring 109*b* at a position that overlaps with the frame portion 106 in a perspective plan view, the internal wiring 113 located on the base portion 105 and the internal wiring 113 located on the frame portion 106 can be electrically continuous with each other from the frame-shaped metallization layer 111 located on the first surface 102 up to the connection wiring 109 located on the second surface 103 to form a short electrically conducting path. Thus, by reducing the electrical resistance in the routing of the plated wiring, a metal layer formed of nickel, gold, or the like can be efficiently positioned on the exposed wiring conductors in each circuit board area. The frame-shaped metallization layer 111 is electrically continuous with the connection wiring 109 through the internal wiring 113, and then, through the narrow portion 112, is electrically continuous with the external connection conductor 115 located on the second surface 103.

One of external connection conductors 115 is connected through the internal wiring 113 to one of electrodes 108 located on the bottom surface of the recessed portion 107. The connection wiring 109 is configured such that a portion of or the whole of the connection wiring 109 is covered with the insulating layer 110, and no metal layer made of nickel, gold, or the like is located on the portion covered with the insulating layer 110. Thus, at the time of connecting the electronic device 200 including the package 100 for housing an electronic component to the module board 301 using the bonding material 303 such as solder, the bonding material 303 such as solder used to connect the external connection conductor 115 located on the second surface 103 side and the connection pad 302 located on the module board 301 can be suppressed from spreading to the connection wiring 109 side. Thus, the external connection conductor 115 connected to the connection wiring 109 can be suppressed from short-circuiting with other external connection conductors 115.

The package 100 for housing an electronic component according to the present disclosure includes a narrow body 112*a* located so as to extend from the insulating layer 110 to the narrow portion 112 and a base (insulating substrate 101). With the configuration described above, the cutting area at the time of cutting the second wiring 109*b* of the connection wiring 109 with a laser is reduced to make it easy to cut the second wiring 109*b*. At the same time, it is possible to provide the package 100 for housing an electronic component that can suppress scattering of cutting chips that are conductors of the second wiring 109*b*. In other words, the narrow portion 112 including the narrow body 112*a* is located at a portion of the second wiring 109*b* in a state of having a small width. This enables the second wiring 109*b* to be cut with a smaller laser irradiation area, which makes it possible to minimize the scattering of cutting chips.

Furthermore, the connection wiring 109 is covered with the insulating layer 110. Thus, when the second wiring 109*b* of the connection wiring 109 is cut with a laser at a position of the narrow portion 112, peeling of the second wiring 109*b* from the base (insulating substrate 101) can be suppressed. In other words, as illustrated in FIG. 7, the connection wiring 109 is covered with the insulating layer 110, and even though both ends of the second wiring 109*b* that has been cut with a laser are exposed on the narrow portion 112 side, the second wiring 109*b* is less likely to be peeled off from the base (insulating substrate 101) because the second wiring 109*b* is sandwiched between the base (insulating substrate 101) and the insulating layer 110 in a cross-sectional view.

Furthermore, since the connection wiring 109, including the first wiring 109*a* and the second wiring 109*b*, is covered with the insulating layer 110, the bonding material 303 such as solder is less likely to spread toward the connection wiring 109 side. Thus, the package 100 for housing an electronic component can be provided in which the external connection conductor 115 connected to the connection wiring 109 can be suppressed from short-circuiting with other external connection conductors 115. The narrow portion 112 is a location where the second wiring 109*b* of the connection wiring 109 is cut. A laser is emitted to cut the second wiring 109*b* by positioning the groove 116 so as to extend over the narrow portion 112. In this manner, the frame-shaped metallization layer 111 and the external connection conductor 115 connected to the electrode 108 located in the recessed portion 107 are electrically separated, and it is possible to electrically check the electronic component 104 mounted at the recessed portion 107, in a state of being less likely to be affected by stray capacitance or the like at the frame-shaped metallization layer 111.

The electronic device 200 according to the present disclosure includes the electronic component 104 at a mounting portion 104*a* in the package 100 for housing an electronic component described in any of the portions above. With the configuration described above, it is possible to provide the electronic device 200 having superior operation reliability for the electronic component 104 as well as high reliability in terms of hermetic sealing.

In other words, even if the second wiring 109*b* of the connection wiring 109 is cut with a laser so that the electrode 108 connected to the electronic component 104 is independent in order to electrically check the electronic component 104 mounted at the recessed portion 107, cutting chips are less likely to scatter toward the recessed portion 107 side because the connection wiring 109 is located on the second surface 103 side that is the opposite surface to the first surface 102 where the recessed portion 107 is disposed. Thus, by using the package 100 for housing an electronic component in which cutting chips are suppressed from scattering toward the recessed portion 107 side, it is possible to suppress occurrence of operation failure of the electronic component 104 resulting from cutting chips, which makes it possible to realize the electronic device 200 having superior operation reliability.

Furthermore, scattering of cutting chips to the frame-shaped metallization layer 111 is suppressed. In addition, occurrence of a bonding failure due to cutting chips is suppressed at the time of bonding the lid 117 made of metal or the like to the frame-shaped metallization layer 111 using a bonding material such as a brazing material. Thus, the electronic device 200 having high reliability in terms of hermetic sealing can be provided.

The electronic module 300 according the present disclosure includes the module board 301 and the electronic device 200 connected to the module board 301 and described above. With the configuration described above, the electronic device 200 having superior operation reliability for the electronic component 104 as well as high reliability in terms of hermetic sealing can be disposed on the module board 301. Thus, the electronic module 300 having high reliability can be realized. In other words, a failure due to cutting chips at the time of cutting the second wiring 109*b* with a laser can be suppressed in the electronic component 104 mounted in the package 100 for housing an electronic component described above. Note that the module board 301 includes the connection pad 302. The electronic device 200 is connected to the connection pad 302 through the bonding material 303 such as solder.

Furthermore, even if the second wiring 109*b* is cut with a laser and the groove 116 is located on the insulating substrate 101, the groove 116 is located on the base portion 105 that overlaps with the frame portion 106. Thus, the frame portion 106 can be used to compensate for a decrease in the strength of the insulating substrate 101, thereby a decrease in the strength of the insulating substrate 101 due to the groove 116 can be suppressed. Thus, it is possible to suppress occurrence of cracks in the insulating substrate 101 due to mechanical stress resulting from deflection or the like of the module board 301. Thus, by using the electronic device 200 having improved reliability in terms of hermetic sealing for the electronic component 104 mounted in the recessed portion 107, the electronic module 300 having superior operation reliability as well as high reliability in terms of hermetic sealing can be realized.

Note that the present disclosure is not limited to the embodiments described above, and various modifications are possible. For example, a configuration has been given in which a pair of electrodes 108 are located at a position that is closer to one side of the recessed portion 107. However, it may be possible to employ a configuration in which three or more electrodes 108 are located at other positions so as to fit the type, the size, or the like of the electronic component 104. In addition, the shape of the insulating substrate 101 need not be a cuboid shape, and may be a polygonal shape other than a quadrilateral shape in plan view or may be a quadrangle shape other than a cuboid shape. Furthermore, description has been made by giving an example in which one of the connection wiring 109 including the first wiring 109a and the second wiring 109b is located on the second surface 103 side. However, two or more of the connection wiring 109 may be positioned in accordance with the type of the electronic component 104, the number of the mounted electronic components 104, the number of electrodes 108 located in the recessed portion 107, or the like.

REFERENCE SIGNS LIST

100 Package for housing an electronic component
101 Insulating substrate
102 First surface
103 Second surface
104 Electronic component
105 Base portion
106 Frame portion
107 Recessed portion
108 Electrode
109 Connection wiring
109a First wiring
109b Second wiring
110 Insulating layer
111 Frame-shaped metallization layer
112 Narrow portion
112a Narrow body
113 Internal wiring
114 Notch
115 External connection conductor
116 Groove
117 Lid
118 Alignment portion
119 Dent
200 Electronic device
300 Electronic module
301 Module board
302 Connection pad
303 Bonding material

The invention claimed is:

1. A package for housing an electronic component comprising:
an insulating substrate comprising:
a first surface comprising a recessed portion in which an electronic component is mounted; and
a second surface located on an opposite side to the first surface;
an external connection conductor located on the second surface;
internal wiring located inside the insulating substrate;
first wiring located on the second surface and connected to the internal wiring; and
second wiring located between the first wiring and the external connection conductor and connected to the external connection conductor,
wherein
the insulating substrate includes:
a base portion having the second surface; and
a frame portion having the first surface and located on the base portion,
the first wiring, the second wiring, and the external connection conductor are a continuous conductor,
the first wiring and the second wiring are covered with an insulating layer,
the second wiring is located so as to overlap the frame portion in a perspective plan view and is configured to be electrically independent of the first wiring by being partially cut.

2. The package for housing an electronic component according to claim 1, wherein
the second wiring is located on an inner side of the base portion relative to the external connection conductor in a perspective plan view.

3. The package for housing an electronic component according to claim 2, wherein
the second wiring has a portion located between an outer edge of the base portion and the recessed portion in a perspective plan view.

4. The package for housing an electronic component according to claim 3, wherein
the second wiring comprises a narrow portion having a narrow width.

5. The package for housing an electronic component according to claim 3, further comprising:
an electrode located in the recessed portion, wherein
the first wiring is electrically connected to the electrode through the internal wiring.

6. The package for housing an electronic component according to claim 2, wherein
the second wiring comprises a narrow portion having a narrow width.

7. The package for housing an electronic component according to claim 2, further comprising:
an electrode located in the recessed portion, wherein
the first wiring is electrically connected to the electrode through the internal wiring.

8. The package for housing an electronic component according to claim 2, further comprising:
a frame-shaped metallization layer disposed at the first surface, wherein
the first wiring is electrically connected to the frame-shaped metallization layer through the internal wiring.

9. The package for housing an electronic component according to claim 1, wherein
the second wiring has a portion located between an outer edge of the base portion and the recessed portion in a perspective plan view.

10. The package for housing an electronic component according to claim 9, wherein
the second wiring comprises a narrow portion having a narrow width.

11. The package for housing an electronic component according to claim 9, further comprising:
an electrode located in the recessed portion, wherein
the first wiring is electrically connected to the electrode through the internal wiring.

12. The package for housing an electronic component according to claim 9, further comprising:
a frame-shaped metallization layer disposed at the first surface, wherein
the first wiring is electrically connected to the frame-shaped metallization layer through the internal wiring.

13. The package for housing an electronic component according to claim 1, wherein
the second wiring comprises a narrow portion having a narrow width.

14. The package for housing an electronic component according to claim 13, further comprising:
an electrode located in the recessed portion, wherein the first wiring is electrically connected to the electrode through the internal wiring.

15. The package for housing an electronic component according to claim 13, further comprising:
a frame-shaped metallization layer disposed at the first surface, wherein
the first wiring is electrically connected to the frame-shaped metallization layer through the internal wiring.

16. The package for housing an electronic component according to claim 1, further comprising:
an electrode located in the recessed portion, wherein
the first wiring is electrically connected to the electrode through the internal wiring.

17. The package for housing an electronic component according to claim 16, further comprising:
a frame-shaped metallization layer disposed at the first surface, wherein
the first wiring is electrically connected to the frame-shaped metallization layer through the internal wiring.

18. The package for housing an electronic component according to claim 1, further comprising:
a frame-shaped metallization layer disposed at the first surface, wherein
the first wiring is electrically connected to the frame-shaped metallization layer through the internal wiring.

19. An electronic device comprising an electronic component in a mounting portion of the package for housing an electronic component according to claim 1.

20. An electronic module comprising:
a module board; and
the electronic device according to claim 19 connected to the module board.

* * * * *